(12) United States Patent
Tateishi et al.

(10) Patent No.: US 9,153,635 B2
(45) Date of Patent: Oct. 6, 2015

(54) LIGHT EMITTING DISPLAY APPARATUS

(71) Applicant: CANON KABUSHIKI KAISHA, Tokyo (JP)

(72) Inventors: Yoshinori Tateishi, Yokohama (JP); Masato Ofuji, Honjo (JP); Hideya Kumomi, Tokyo (JP); Ryo Hayashi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/059,949

(22) Filed: Oct. 22, 2013

(65) Prior Publication Data

US 2014/0042441 A1    Feb. 13, 2014

Related U.S. Application Data

(63) Continuation of application No. 13/001,000, filed as application No. PCT/JP2009/062263 on Jun. 30, 2009, now Pat. No. 8,592,815.

(30) Foreign Application Priority Data

Jul. 3, 2008  (JP) .................................. 2008-174484

(51) Int. Cl.
```
H01L 29/10      (2006.01)
H01L 31/0376    (2006.01)
H01L 29/04      (2006.01)
H01L 21/00      (2006.01)
H01L 27/32      (2006.01)
H01L 27/12      (2006.01)
H01L 29/786     (2006.01)
```

(52) U.S. Cl.
CPC ............ *H01L 27/3272* (2013.01); *H01L 27/12* (2013.01); *H01L 29/7869* (2013.01); *H01L 29/78633* (2013.01)

(58) Field of Classification Search
CPC . H01L 27/3272; H01L 33/0079; H01L 21/16; H01L 27/1214; H01L 27/12; H01L 29/7869; H01L 33/62; H01L 33/486; H01L 27/3244; H01L 27/3246; H01S 5/0262; H01S 5/0264
USPC .......... 438/22, 24, 29, 34, 39; 257/43, 59, 72, 257/81, 83, 222
See application file for complete search history.

(56) References Cited

U.S. PATENT DOCUMENTS

| | | | |
|---|---|---|---|
| 7,224,032 B2 * | 5/2007 | Shiraki et al. ................ 257/347 |
| 8,216,879 B2 * | 7/2012 | Kaji et al. .................... 438/104 |
| 2007/0090365 A1 | 4/2007 | Hayashi et al. | |
| 2011/0062441 A1 * | 3/2011 | Yabuta et al. ................... 257/43 |
| 2011/0076790 A1 * | 3/2011 | Ofuji et al. ...................... 438/17 |

* cited by examiner

*Primary Examiner* — Hsien Ming Lee

(74) *Attorney, Agent, or Firm* — Canon USA, Inc. IP Division

(57) ABSTRACT

There is provided a light emitting display apparatus including at least a light emitting element and a thin film transistor (TFT) for driving the light emitting element, characterized in that a mechanism is provided in which a semiconductor constituting the TFT is irradiated with at least a part of light whose wavelength is longer than a predetermined wavelength among the light emitted by the light emitting element.

17 Claims, 3 Drawing Sheets

LIGHT EMITTING DISPLAY APPARATUS

CROSS-REFERENCE TO RELATED APPLICATION

This application is a Continuation of co-pending U.S. patent application Ser. No. 13/001,000, filed Dec. 22, 2010, which is a National Phase application of International Application PCT/JP09/062,263, filed Jun. 30, 2009, which claims the benefit of Japanese Patent Application No. 2008-174484, filed Jul. 3, 2008 which is hereby incorporated by reference herein in its entirety.

TECHNICAL FIELD

The present invention relates to a light emitting display apparatus including a TFT.

BACKGROUND ART

For achieving high performance, low temperature manufacturing process and low cost of a thin film transistor (TFT), a wide variety of channel layer materials have been studied at present. The materials include amorphous silicon, polycrystal silicon, microcrystal silicon and organic semiconductor, for example.

An oxide semiconductor found in recent years is another potential candidate as the material. A TFT using in its channel layer an amorphous In—Zn—O(IZO) thin film and an amorphous In—Ga—Zn—O(IGZO) thin film is disclosed in papers: Barquinha et al., J. Non-Cryst. Sol., 352, 1756 (2006); and Yabuta et al., Appl. Phys. Lett., 89, 112123 (2006).

A TFT exhibits a threshold voltage different according to a semiconductor material of its channel layer and manufacturing process. The threshold voltage of the TFT is changed by various causes (such as manufacturing process hysteresis, aging, electrical stress and thermal stress). The electrical stress is caused by applying voltage or current to a semiconductor. The thermal stress is caused by external heating or Joule heat generated by applying current to a semiconductor. Actually, these stresses are sometimes simultaneously applied to the TFT.

The threshold voltage of the above oxide semiconductor TFT is unexceptionally changed by the electrical stress or a composite of the electrical and the thermal stress. This is disclosed in papers: Riedl et al, Phys. Stat. Sol., 1, 175 (2007); and Kim et al., International Electron Device meeting 2006 (IEDM '06), 11-13, 1 (2006).

There is disclosed that irradiating the oxide semiconductor TFT with a visible light and an ultraviolet ray changes various properties of the TFT including the threshold voltage in papers: Barquinha et al., J. Non-Cryst. Sol., 352, 1756 (2006); and Gorrn et al., Appl. Phys. Lett., 91, 193504 (2007). For polycrystal silicon, Japanese Patent Application Laid-Open No. H10-209460 discloses a method of reducing the threshold voltage by irradiating the channel layer of the TFT with light.

Many experiments have been done to provide each pixel with an electrical circuit formed of a plurality of transistors and capacitors in a light emitting display apparatus to compensate change in the threshold voltage.

DISCLOSURE OF THE INVENTION

A TFT for driving a pixel used in an electroluminescence light emitting display apparatus has a problem in that electrical or thermal stress applied to the TFT caused by driving the light emitting element changes the threshold voltage with time. This is because the electroluminescence light emitting display apparatus causes a disturbance of an image by change in the threshold voltage during the operation of the apparatus.

Compensating change in the threshold voltage has required forming an electrical circuit (compensating circuit) using a large number of TFTs and capacitors for each pixel. This method, however, increases the number of TFTs per pixel and makes it difficult to increase the resolution of the display apparatus.

The present invention has been made in view of the above problems and an object of the invention is to provide a light emitting display apparatus capable of compensating or suppressing change in the threshold voltage of a driving TFT.

The present invention is directed to a light emitting display apparatus including at least a light emitting element and a thin film transistor (TFT) for driving the light emitting element, characterized in that a mechanism is provided in which a semiconductor constituting the TFT is irradiated with at least a part of light whose wavelength is longer than a predetermined wavelength among the light emitted by the light emitting element.

The wavelength of the light with which the semiconductor constituting the TFT is irradiated can be longer than the absorption edge wavelength of the semiconductor.

The light emitting display apparatus can further comprises a unit for shielding the semiconductor constituting the TFT from the light whose wavelength is shorter than the absorption edge wavelength of the semiconductor.

The shielding unit can be a color filter.

The surface density of in-gap level of the semiconductor can be $10^{13}$ cm$^{-2}$ eV$^{-1}$ or less.

The semiconductor can be an oxide semiconductor including any of In, Ga, Zn and Sn.

In the light emitting display apparatus, the TFT at least can include a gate electrode formed on a substrate, an insulating film formed to cover the gate electrode, a semiconductor formed on the insulating film and a source and a drain electrode formed on the semiconductor, a light shielding film can be provided between the light emitting element and the semiconductor, and the mechanism can include a light transmissive region formed in at least a part of the light shielding film.

The light transmissive region can be a slit.

The mechanism can be a reflector that reflects at least a part of light whose wavelength is longer than a predetermined wavelength among the light emitted by the light emitting element and provided in a position where the reflector can reflect the light to the semiconductor of the TFT.

In the light emitting display apparatus, the TFT can include at least a source and drain electrodes formed over a substrate, the semiconductor formed to extend over the source and drain electrodes, an insulating film formed to cover the semiconductor and a gate electrode formed on the insulating film, and the mechanism can include a light transmissive region provided in at least a part of the gate electrode.

The present invention can compensate or suppress temporal change in the threshold voltage of the driving TFT or change due to electrical or thermal stress in the light emitting display apparatus.

Further features of the present invention will become apparent from the following description of exemplary embodiments with reference to the attached drawings.

BEST MODES FOR CARRYING OUT THE INVENTION

Preferred embodiments of the present invention will now be described in detail in accordance with the accompanying drawings.

The embodiment of the light emitting display apparatus according to the present invention is described in detail below with reference to the drawings.

Figure 1:
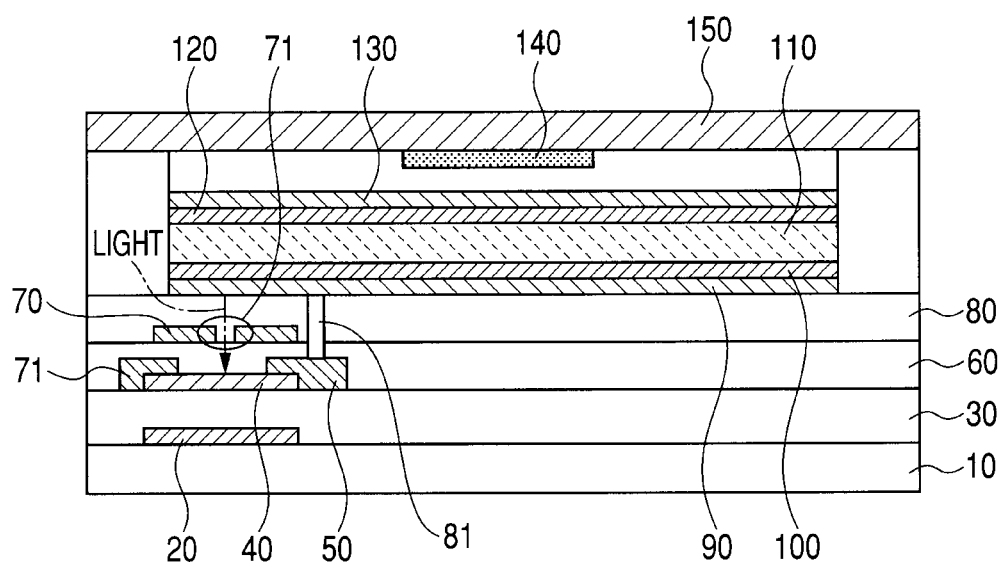
FIG. 1 is a cross section of the light emitting display apparatus according to an embodiment of the present invention.

FIG. 1 is a cross section of the light emitting display apparatus according to an embodiment of the present invention. A gate electrode 20 is provided on an insulating substrate 10, a gate insulating film 30 is provided on the gate electrode 20 and the substrate 10 to cover the gate electrode 20 and a semiconductor film 40 is provided on the gate insulating film 30. In addition, a source electrode 50 and a drain electrode 50 are provided on the semiconductor film 40 and a channel protecting film 60 is provided to cover the semiconductor film 40, the source electrode 50 and the drain electrode 51 to form a thin film transistor (TFT) for drive. A light shielding film 70 is provided on the channel protecting layer 60 to cover the semiconductor film 40 when viewed from the top. A protective film 80 is provided on the light shielding film 70 and the channel protecting layer 60. The source electrode 50 is connected to an anode electrode 90 through a contact hole 81 to constitute a light emitting element formed of a hole transport layer 100, a light emitting layer 110, an electron transport layer 120 and a cathode electrode 130. The TFT, the light emitting element and a desiccant 140 are sealed by a sealing cap 150 to form the light emitting apparatus.

The light shielding film 70 is provided with a mechanism for irradiating the semiconductor forming the TFT with at least a part of light whose wavelength is longer than a predetermined wavelength among the light emitted by the light emitting element. The semiconductor is irradiated with at least only a part of light among the light emitted by the light emitting element, whose wavelength is longer than the predetermined wavelength, through the mechanism. This allows suppressing or changing the threshold voltage of the TFT changed due to aging, electrical stress and thermal stress. The reason why the threshold voltage of the TFT is changed by irradiating the semiconductor with the light is that fixed charge such as a carrier trapped inside the semiconductor or around the semiconductor, for example, may be released by irradiation with light. Irradiation with light whose wavelength is shorter than the absorption edge wavelength of the semiconductor increases S value of a transfer curve to change a curve profile and TFT properties in addition to the threshold voltage, which requires the irradiation of the semiconductor with the light whose wavelength is longer than the predetermined wavelength.

In the present embodiment, there is provided in the light shielding film 70 a light transmissive region 71 for transmitting at least a part of the light as the mechanism for irradiating the semiconductor with at least a part of light whose wavelength is longer than the predetermined wavelength among the light emitted by the light emitting apparatus. If the light emitted by the light emitting element is longer in wavelength than the predetermined light, it is enabled to use a slit provided in the light shielding film 70 as the light transmissive region 71.

The transmittance of the light transmissive region 71, an areal ratio of the light transmissive region 71 to the light shielding film 70 and the position thereof may be determined from the wavelength of light emitted by the light emitting layer 110 and the amount of change in the threshold voltage of the TFT. Suppose that the threshold voltage of the TFT is comparably changed using two kinds of light emitting layers each emitting light whose wavelength is different from each other. The area of the light transmissive region 71 needs to be smaller, in the case where the light emitting layer emitting light whose wavelength is short (a center wavelength is approximately 460 nm) is used, than the case where the light emitting layer 110 emitting light whose wavelength is long (a center wavelength is approximately 650 nm) is used. This is because the short wavelength larger in energy than the long wavelength increases the amount of shift in the threshold voltage of the TFT, requiring the amount of light reaching the semiconductor film to be reduced by decreasing the area of the light transmissive region 71. The transmittance of the light transmissive region 71, an areal ratio of the light transmissive region 71 to the light shielding film 70 and the position thereof are determined so that the threshold voltage of the TFT can be changed in an appropriate range by the above method.

It is desirable to adjust the wavelength to a wavelength longer than the absorption edge wavelength of the semiconductor to irradiate the light having the adjusted wavelength with the semiconductor. This allows the semiconductor to be recovered to the state nearest to properties before the occurrence of change in the threshold voltage. In the present invention, the term absorption edge wavelength refers to a wavelength the lowest in energy in light absorption based on interband transition of a free carrier in the semiconductor. As used in a general amorphous semiconductor, the absorption edge wavelength of the present invention is defined by an x-intercept extrapolated to the x axis with $\sqrt{ahv}$ plotted with respect to photon energy hv, where, h is Planck constant (J·s), v is oscillation frequency (Hz) of a photon and a is absorption coefficient ($cm^{-1}$).

It is also desirable that the semiconductor is sufficiently shielded from light whose wavelength is shorter than the absorption edge wavelength. This is because irradiation with a short-wavelength light significantly changes other properties in addition to the threshold voltage. The influence remains on the semiconductor after the short-wavelength light is shut off as is the case with a long-wavelength light. The change in various properties of the semiconductor during the irradiation of the semiconductor with light whose wavelength is shorter than the absorption edge wavelength may be associated with significant change in carrier density of valence band and conduction band or the occupational state of in-gap levels due to the interband transition of a carrier by light. For this reason, the light emitting display apparatus can be further provided with a unit capable of sufficiently shielding light whose wavelength is shorter than the absorption edge wavelength.

A color filter may be used as the unit for sufficiently shielding light. The color filter selectively transmits only light in a required wavelength range and is arranged at any position of an optical path through light emitted from the light emitting element reaches the semiconductor. The color filter provides transmitted light with appropriate intensity attenuation, so that the color filter is suited to be used as a dimming mechanism for adjusting the intensity or the wavelength of irradiation light in a semiconductor device. The color filter is in a film form or in a plate form and suited to be arranged in the apparatus. The color filter is generally inexpensive and can reduce the increase in cost due to the arrangement of the dimming mechanism as much as possible.

Figure 5:
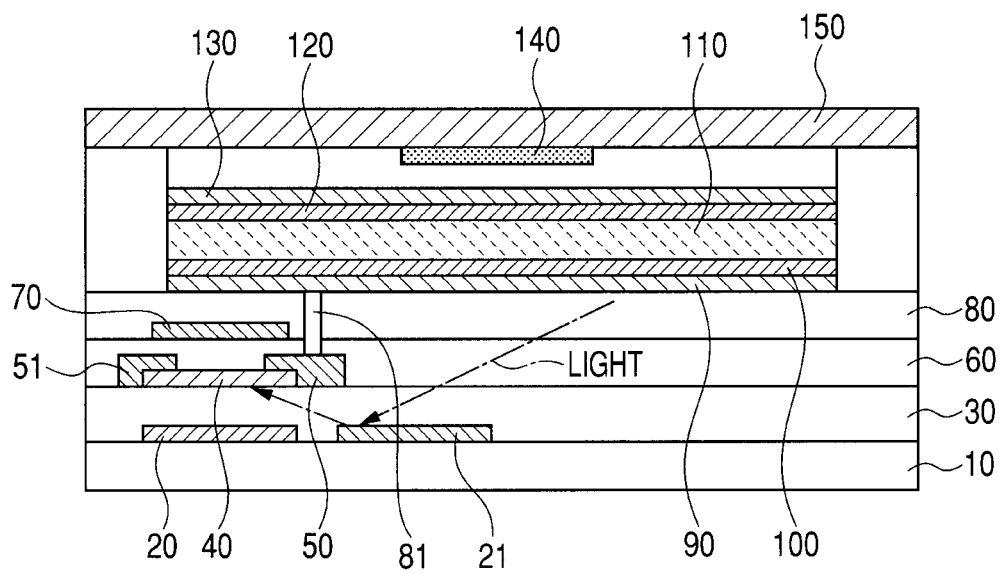
FIG. 5 is a cross section of the light emitting display apparatus according to another embodiment of the present invention.

As another example of the mechanism for irradiating the semiconductor with at least a part of light whose wavelength is longer than the predetermined wavelength, a reflector may be provided on the substrate as illustrated in FIG. 5. Although a reflector 21 is provided as a reflector in an example in FIG. 5, the part corresponding to the reflector may be surface-treated to reflect only light with a predetermined wavelength. For example, if light incident on the reflector is in the predetermined wavelength range, a totally reflecting material (metal material such as Ag and Al, for example) may be provided on the surface of the reflector. If the reflector reflects only light in a specific wavelength range, a material that absorbs or transmits light in the wavelength range excluding the specific wavelength range is used as the reflector or a surface is treated to absorb light in the wavelength range excluding the specific wavelength range (irregularity, for example, is provided on the surface). For the semiconductor device illustrated in FIG. 5, light emitted by the light emitting layer 110 is reflected by the reflector 21 for the conduction of light to fall on the semiconductor film 40, varying the threshold voltage of the TFT changed due to electrical stress.

Figure 6:
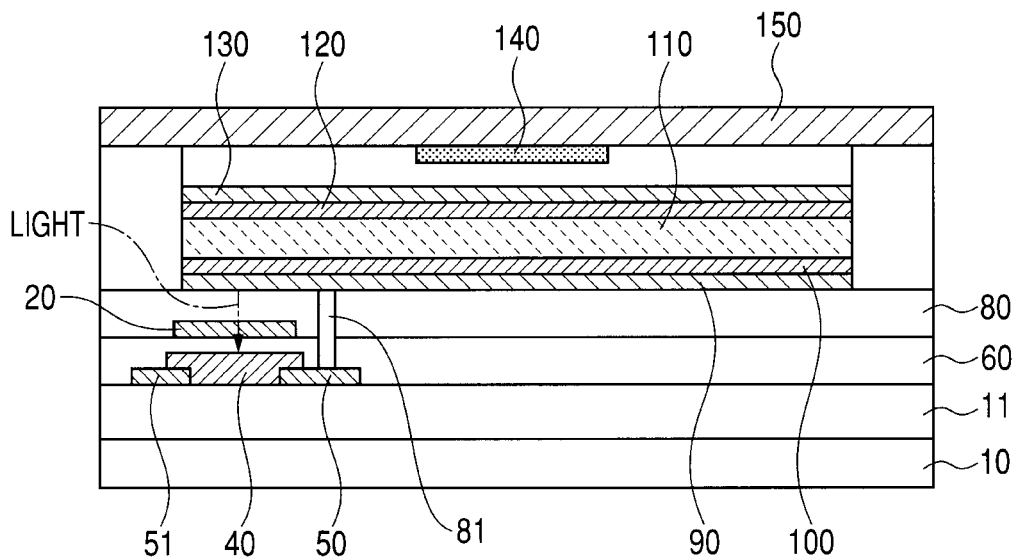
FIG. 6 is a cross section of the light emitting display apparatus according to further another embodiment of the present invention.

FIG. 6 illustrates another example of the mechanism for irradiating the semiconductor with at least a part of light whose wavelength is longer than the predetermined wavelength. The TFT is fabricated in a top-gate configuration. That is to say, the source electrode 50 and the drain electrode 51 are formed over the substrate 10 and the semiconductor film 40 is formed such that the semiconductor film 40 extends over the source electrode 50 and the drain electrode 51. An insulating film (channel protecting film 60) is formed to cover the semiconductor film 40 and the gate electrode 20 is formed on the semiconductor film 40 situated between the source electrode 50 and the drain electrode 51 and the insulating film. In the present embodiment, a light transmissive region is provided in at least a part of the gate electrode 20 and serves as the foregoing mechanism. The use of a transparent conductor such as ITO or IZO as a material for the gate electrode 20 allows light with short wavelength to be shut off. For the ITO, for example, if a band gap is 3.75 eV, light with a wavelength of 330 nm or shorter can be shut off.

As a material for the insulating substrate 10, there may be used glass, polycarbonate, polyimide, a laminate in which silicon nitride film is stacked thereon and a laminate in which silicon nitride film is stacked on silicon, aluminum or iron alloy.

As a material for the gate electrode 20, it is desirable to use metals such as aluminum (Al), silver (Ag), molybdenum (Mo) and titanium (Ti). In addition to the above materials, there may be used a laminate formed of two or more kinds of metals such as titanium and aluminum or multi-element alloy.

As a material for the gate insulating film 30, there may be used an insulating film such as a silicon oxide film, a silicon nitride film and a silicon oxide and nitride film and a laminate film thereof.

As a material for the light shielding film 70, it is desirable to use a material capable of sufficiently shielding light emitted by the light emitting element, such as molybdenum (Mo), titanium (Ti) and the like. In addition to the above materials, there may be used a laminate formed of two or more kinds of the materials or multi-element alloy.

As a material for the semiconductor film 40, it is desirable to use a semiconductor with a surface density of in-gap level of $10^{13}$ cm$^{-2}$ eV$^{-1}$ or less because of reducing the influence of excitation of an electron (or a hole) by irradiating the semiconductor film with light whose wavelength is sufficiently longer than the absorption edge wavelength. It is further desirable that the band gap of the semiconductor is 2.7 eV or higher to make the absorption edge wavelength shorter than the emission spectrum of the light emitting element. The reason is that the energy of "blue" (short in wavelength and its center wavelength is 460 nm) largest in energy is 2.7 eV calculated from $E=hv=Hc/\lambda$ in the case of the emission spectrum of the light emitting element forming the light emitting display element. For this reason, the increase of band gap of the semiconductor to 2.7 eV or higher enables suppressing the change in the S value of the semiconductor (the inverse number of inclination of a Log(Ids)-Vgs curve in the vicinity of Von) and saturation mobility. As the semiconductor satisfying the above conditions, there has been known an oxide semiconductor including at least any of In, Ga, Zn and Sn. Among them, amorphous In—Ga—Zn—O (IGZO) and amorphous In—Zn—O are applicable to the present invention.

As materials for the source electrode 50 and the drain electrode 51, there can be used titanium (Ti), molybdenum (Mo) and ITO which can be brought into ohmic contact with the semiconductor layer. There may be used a laminate formed of two or more kinds of materials, or multi-element alloy.

As a material for the channel protecting film 60, there may be used an insulating film such as a silicon oxide film, a silicon nitride film and a silicon oxide and nitride film. A laminate formed of two or more kinds of materials may also be used.

A transparent conductor such as ITO, IZO or the like may be used as a material for the anode electrode 90.

As a material for the hole transport layer 100, α-NPD, PEDOT or the like may be used.

As a material for light emitting layer 110, an appropriate material is selected from among organic EL light emitting materials based on emission spectrum.

As a material for the electron transport layer 120, Alq3, PBD or the like may be used.

As a material for the cathode electrode 130, aluminum (Al), silver (Ag) or the like may be used. There may also be used a laminate formed of two or more kinds of the materials or multi-element alloy.

EXAMPLES

The examples of the present invention are described below, but the present invention is not limited to the following examples.

First Example

In the present example, the following TFT was fabricated to examine the dependency of the change in the threshold voltage on wavelength for estimating the effect of light irradiation on the change in the threshold voltage.

Figure 2:
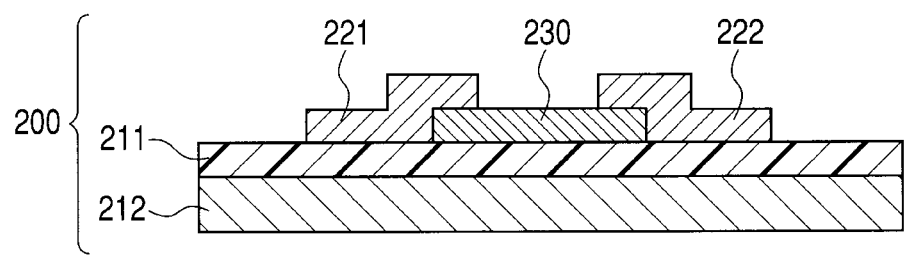
FIG. 2 is a cross section of a TFT describing the present invention.

A TFT to which the present invention is applicable was fabricated in the following steps. FIG. 2 is a cross section thereof.

An n$^+$-silicon wafer (height 20 mm×width 20 mm×depth 0.525 mm) with a silicon thermal oxidation film (thickness of 100 nm) was washed to be used as a substrate. An amorphous IGZO being a semiconductor was deposited on the substrate by RF magnetron sputtering (deposition gas of $O^2$ (5% by volume)+Ar, a deposition pressure of 0.5 Pa, an applied power of 200 W and a film thickness of 20 nm). The temperature of the substrate is not particularly controlled during the sputtering deposition. The amorphous IGZO was patterned to a predetermined size by etching to form a channel layer. The entire channel layer was then heated at 300° C. for 20 minutes under an atmospheric condition. A photoresist film was formed and patterned thereon and then titanium and gold were deposited to a depth of 100 nm in total by electron beam evaporation and the resist film was lifted off to form the source and drain electrodes.

The above steps provide a TFT 200 including a conducting part of the substrate as a gate electrode 212, a thermal oxidation film as a gate insulating film 211, an amorphous IGZO as a channel layer 230, a source electrode 221 and a drain electrode 222. A channel width W is 80 μm and a channel length L is 10 μm. The measurement of the transfer characteristic (Ids-Vgs characteristic, where Ids is a drain-source current and Vgs is a gate-source voltage) of the TFT at a drain-source voltage Vds of +20 V exhibits an n-channel characteristic. The threshold voltage (Vth) and the saturation mobility (sat) determined by the linear approximation of the $\sqrt{Ids}$-Vgs characteristic are 4.8 V and 12.9 $cm^2 \cdot V^{-1} \cdot s^{-1}$ respectively. The S value is 0.6 $V \cdot dec^{-1}$.

There is examined below the dependency of light irradiation on wavelength in the TFT fabricated in the above manner. The channel of the TFT 200 was irradiated with monochromatic light obtained by leading light from a xenon lamp to a diffraction grating spectroscope. An optical slit width of the spectroscope is 24 nm. The density of a neutral density (ND) filter put into an optical path is adjusted so that the intensity of irradiation is 0.2 $mW \cdot cm^{-2}$ for each wavelength.

Figure 3:
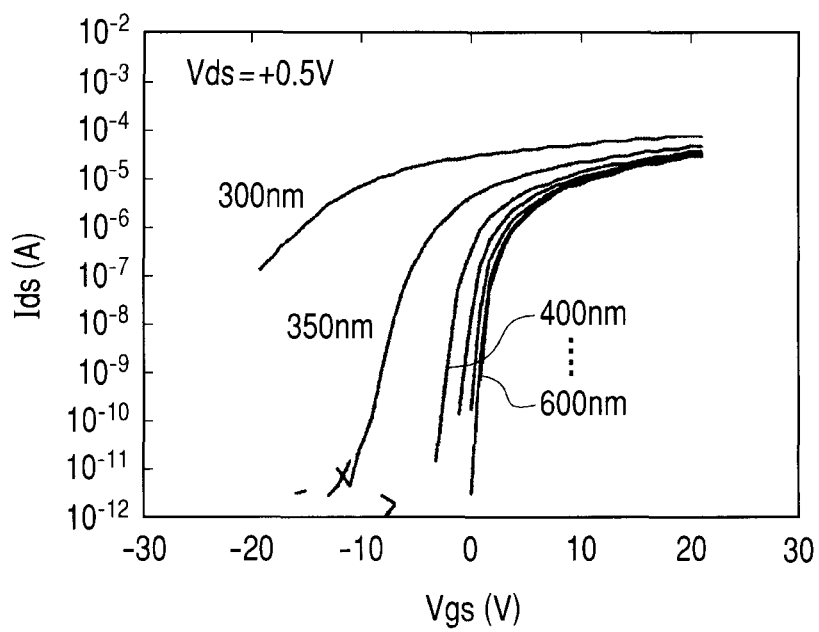
FIG. 3 is a chart describing the influence of light irradiation on the transfer characteristic of the TFT to which the present invention can be applied.

The TFT was irradiated with monochromatic light having a wavelength of 600 nm for 100 seconds and then the transfer characteristic was measured at a Vds of +0.5 V with the TFT irradiated with the light. Similarly, the TFT was irradiated with monochromatic light having a wavelength of 590 nm for 100 seconds and then the transfer characteristic was measured with the TFT irradiated with the light. Similarly, measurement was conducted while wavelength was being scanned by decrements of 10 nm to wavelength of 300 nm. The measurements are illustrated in FIG. 3. For the sake of simplicity of the figure, the transfer curves are drawn in decrements of 50 nm, with the irradiation light wavelength reduced from 600 nm to 550 nm, 500 nm, and so on. The transfer curves monotonously move to the negative direction of Vgs without changing the shape of the transfer curve as the wavelength of the irradiation light is shortened. Furthermore, the S value is increased and the shape of the transfer curve is changed on the side of the wavelength shorter than the absorption edge wavelength of the semiconductor. Thereby, it is obvious that irradiation with light having a wavelength longer than an absorption wavelength of 390 nm of the amorphous IGZO allows shifting the threshold voltage to the negative side without changing the shape of the transfer curve.

Consequently, in the light emitting display apparatus of the present example, the light emitting layer irradiating the semiconductor film with light having a wavelength longer than the absorption wavelength of the semiconductor through the light transmissive region allows shifting the threshold voltage shifted to the positive side caused by electrical stress to the negative side.

Second Example

In the present example, the TFT similar to that in the first example was fabricated to examine whether light irradiation under various conditions can compensate or suppress the change in the threshold voltage caused by electrical stress.

Four TFTs similar to those in the first example were fabricated to measure the transfer characteristic at a Vds of +20 V at a dark place. Vds of +0.1 V and Vgs of +20 V as electrical stress were applied to the TFTs for 1800 seconds. The TFTs were irradiated with monochromatic light for 1800 seconds under the following conditions different according to the TFTs:

(4-1) No light irradiation
(4-2) 400 nm and 0.02 $mW/cm^2$
(4-3) 400 nm and 0.2 $mW/cm^2$
(4-4) 600 nm and 0.2 $mW/cm^2$.

After that, the light irradiation was stopped and then the transfer characteristic of the TFTs was measured again at a Vds of +20 V at a dark place.

Figure 4:
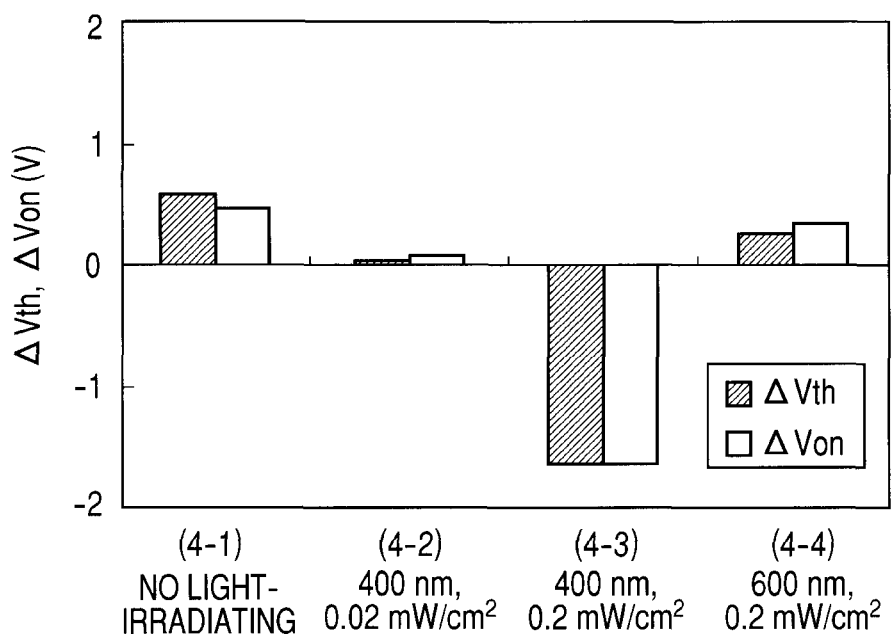
FIG. 4 is a chart describing a second example.

There were determined Vth (threshold voltage), Von (rise voltage, Vgs at which Ids exceeds $10^{-10}$ A), μsat (saturation mobility) and the S value (the inverse number of inclination of a Log(Ids)-Vgs curve in the vicinity of Von) from each transfer characteristic measured before and after the application of the electrical stress. FIG. 4 illustrates change in ΔVth(V) and ΔVon (V) of Vth and Von caused by stress. On the other hand, the saturation mobility μsat and the S value before and after the application of the electrical stress are little changed with respect to the initial value, i.e., less than 2% and 6% respectively in each case and the transfer curves are shifted in parallel with the shape of the curve maintained. Thus, the threshold voltage of the TFT could be changed.

Like the above condition (4-2), the irradiation of the TFT causing change in the threshold voltage due to electrical stress with light does not cause change in the threshold voltage, thereby allowing the compensation of change in the threshold voltage.

Like the above condition (4-4), the irradiation of the TFT causing change in the threshold voltage due to electrical stress with light having a wavelength of 600 nm makes change in the threshold voltage smaller than the TFT which is not irradiated with light, thereby allowing the suppression of change in the threshold voltage.

In all the above examples, the characteristics such as charge mobility, the S value and the like excluding the threshold voltage of the semiconductor element can be maintained equivalently to the characteristics obtained before the application of the electrical stress and irradiation with light.

Consequently, in the light emitting display apparatus of the present example, it is enabled to control the threshold voltage of the TFT by appropriately selecting through the light transmissive region the wavelength and the intensity of light which is emitted from the light emitting layer and has a wavelength longer than the absorption edge wavelength of the semiconductor and by irradiating the semiconductor film with the light.

Third Example

In the present example, there is fabricated the light emitting display apparatus being an embodiment of the present invention illustrated in FIG. 5.

The gate electrode 20 and aluminum alloy as the light guiding reflector 21 are formed on the glass substrate 10 to a thickness of 100 nm with a DC magnetron sputtering apparatus and processed in a photolithography process and a wet-etching process. The gate electrode 20 and the light guiding reflector 21 may be connected together or formed in different layers. Then, silicon oxide as the gate insulating film 30 is formed to a thickness of 200 nm with an RF magnetron sputtering apparatus (an inter-electrode distance of 110 mm, a power RF of 500 W, Ar of 100 sccm, a pressure of 0.2 Pa and a discharge time of 6 minutes). The amorphous IGZO semiconductor film 40 is formed on the gate insulating film 30 to a thickness of 30 nm with the DC magnetron sputtering apparatus (an inter-electrode distance of 110 mm, a power DC of 300 W, $O_2$/Ar=2/98 sccm, a pressure of 0.2 Pa and a discharge time of 35 minutes) and then processed in the photolithography process and the wet-etching process (1N of dil. HCl at 23° C.). Molybdenum as the source electrode 50 and the drain electrode 51 is formed on the semiconductor film 40 to a thickness of 100 nm with the DC magnetron sputtering apparatus and processed to a desired shape in the photolithography process and the dry-etching process. Silicon oxide as the channel protecting film 60 is formed thereon to a thickness of 200 nm with the RF magnetron sputtering apparatus (an inter-electrode distance of 110 mm, a power RF of 300 W, $O_2$/Ar=0/180 sccm, a pressure of 0.2 Pa and a time of 25 minutes), thereby providing the TFT. Molybdenum as the light shielding film 70 is formed to cover the semiconductor film to a thickness of 100 nm with the DC magnetron sputtering apparatus and processed in the photolithography process and the wet-etching process.

Silicon nitride as the protective film 80 is formed to a thickness of 200 nm with the CVD apparatus. The contact hole 81 is formed by the photolithography process and the dry-etching process.

ITO as the anode electrode 90 is formed to a thickness of 150 nm with the DC magnetron sputtering apparatus and processed in the photolithography process and the wet-etching process. Thereafter, the hole transport layer 100, the light emitting layer 110 and the electron transport layer 120 are formed as a light emitting part and aluminum was formed as the cathode electrode 130.

Finally, the desiccant 140 is sealed in a sealing can 150.

The structure in which emitted light is reflected by the light guiding reflector 21 and incident on the amorphous IGZO of the semiconductor film 40 allows suppressing change in the threshold voltage due to the electrical stress.

Fourth Example

In the present example, there is fabricated the light emitting display apparatus being an embodiment of the present invention illustrated in FIG. 6.

Silicon oxide as an underlying film 11 is formed on the glass substrate 10 to a thickness of 200 nm with the RF magnetron sputtering apparatus (an inter-electrode distance of 110 mm, a power RF of 500 W, Ar of 100 sccm, a pressure of 0.2 Pa and a discharge time of 6 minutes). Then, molybdenum as the source electrode 50 and the drain electrode 51 is formed to a thickness of 100 nm with the DC magnetron sputtering apparatus and processed in the photolithography process and the dry-etching process. The amorphous IGZO semiconductor film 40 is formed to a thickness of 30 nm with the DC magnetron sputtering apparatus (an inter-electrode distance of 110 mm, a power DC of 300 W, $O_2$/Ar=2/98 sccm, a pressure of 0.2 Pa and a discharge time of 35 seconds) and then processed in the photolithography process and the wet-etching process. Silicon oxide as an insulating film (the channel protecting film 60) is formed to a thickness of 200 nm with the RF magnetron sputtering apparatus (an inter-electrode distance of 110 mm, a power RF of 300 W, $O_2$/Ar=20/180 sccm, a pressure of 0.2 Pa and a time of 25 minutes). The ITO as the gate electrode 20 is formed to a thickness of 30 nm with the DC magnetron sputtering apparatus and processed in the photolithography process and the wet-etching process.

Molybdenum (Mo) or aluminum (Al) may be stacked to a gate wiring part to reduce its resistance. However, a part of the gate electrode on the channel is formed of a transparent electrode of ITO to conduct emitted light to the channel part of the TFT. Silicon nitride as the protective film 80 is formed to a thickness of 20 nm with the CVD apparatus. The contact hole 81 is formed by the photolithography process and the dry-etching process.

As is the case with the third example, ITO as the anode electrode 90 is formed to a thickness of 150 nm with the DC magnetron sputtering apparatus and processed in the photolithography process and the wet-etching process. Thereafter, the hole transport layer 100, the light emitting layer 110 and the electron transport layer 120 are formed as a light emitting part and aluminum was formed as the cathode electrode 130.

Finally, the desiccant 140 is sealed in a sealing can 150.

The structure in which emitted light is transmitted through the transparent gate electrode 20 and incident on the amorphous IGZO of the semiconductor film 40 allows compensating change in the threshold voltage due to the electrical stress.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A display apparatus comprising:
   a substrate;
   a light emitting element having an anode electrode, a cathode electrode and a light emitting layer;
   a thin film transistor for driving the light emitting element, the thin film transistor comprising a gate electrode, a gate insulating layer, a semiconductor layer which includes an oxide semiconductor, a source electrode, and a drain electrode; and
   a color filter located on an optical path from the light emitting element to the semiconductor layer,
   wherein the color filter has a specific spectral absorption property so as to attenuate a light with a shorter wavelength than an absorption edge wavelength of the oxide semiconductor and selects light irradiated from the light emitting element to the semiconductor layer with regard to a wavelength, and
   wherein the source electrode of the thin film transistor is connected to the anode electrode through a contact hole.

2. The display apparatus according to claim 1, wherein a surface density of in-gap level of the oxide semiconductor is $10^{13}$ cm$^{-2}$ eV$^{-1}$ or less.

3. The display apparatus according to claim 1, wherein the oxide semiconductor includes at least one of In—Ga—Zn—O and In—Zn—O.

4. The display apparatus according to claim 3, wherein the oxide semiconductor is amorphous.

5. The display apparatus according to claim 1, wherein the color filter is provided to cover the semiconductor layer when viewed from the light emitting element side.

6. The apparatus according to claim 1,
   wherein the thin film transistor is a bottom gate configuration, and
   wherein the gate electrode is located between the gate insulating layer and the substrate.

7. The display apparatus according to claim 1,
   wherein the light emitting layer includes an organic electroluminescence light emitting material.

8. A display apparatus comprising, in this order:
   a substrate;

a thin film transistor for driving a light emitting element, the thin film transistor comprising a gate electrode, a gate insulating layer, a semiconductor layer which includes an oxide semiconductor, a source electrode, a drain electrode and a protecting layer provided to cover the semiconductor layer, the source electrode and the drain electrode;

a filter which is provided to cover the semiconductor layer when viewed from the light emitting element; and a layer which performs as a light emitting layer in the light emitting element, wherein the filter has a specific spectral absorption property so as to attenuate a light with a shorter wavelength than an absorption edge wavelength of the oxide semiconductor, and wherein the protective layer comprises at least one of a silicon oxide film, a silicon nitride film, and a silicon oxide and nitride film.

9. The display apparatus according to claim 8,
wherein the thin film transistor is a bottom gate configuration, and
wherein the gate electrode is located between the gate insulating layer and the substrate.

10. The display apparatus according to claim 8,
wherein the light emitting element comprises an anode electrode, a cathode electrode and the layer provided between the anode electrode and the cathode electrode, and
wherein the source electrode of the thin film transistor is connected to the anode electrode through a contact hole.

11. The display apparatus according to claim 10, wherein the layer comprises an organic electroluminescence light emitting material.

12. A display apparatus comprising:
a substrate;
a light emitting element, the light emitting element comprising an anode electrode, a cathode electrode and a layer including a light emitting material;

a thin film transistor for driving the light emitting element, the thin film transistor comprising a gate electrode, a gate insulating layer, a semiconductor layer which includes an oxide semiconductor, a source electrode, a drain electrode and a protecting layer provided to cover the semiconductor layer, the source electrode and the drain electrode; and a filter, the filter being in a layer that is interposed between the layer including the light emitting material and the protecting layer and being provided to cover the semiconductor layer when viewed from the light emitting element side, wherein the filter has a specific spectral absorption property so as to attenuate a light with a shorter wavelength than an absorption edge wavelength of the oxide semiconductor, and wherein the source electrode of the thin film transistor is electrically connected to the anode electrode through a contact hole.

13. The display apparatus according to claim 12, wherein the oxide semiconductor includes at least one of In—Ga—Zn—O and In—Zn—O.

14. The display apparatus according to claim 13, wherein the oxide semiconductor is amorphous.

15. The display apparatus according to claim 12, wherein the protecting layer comprises at least one of a silicon oxide film, a silicon nitride film, and a silicon oxide and nitride film.

16. The display apparatus according to claim 12, wherein the light emitting material is an organic electroluminescence light emitting material.

17. The display apparatus according to claim 12,
wherein the thin film transistor is a bottom gate configuration, and
wherein the gate electrode is located between the gate insulating layer and the substrate.

* * * * *